United States Patent
Chu

(10) Patent No.: US 11,145,596 B2
(45) Date of Patent: Oct. 12, 2021

(54) PACKAGE STRUCTURE AND METHOD OF FORMING THE SAME

(71) Applicant: Winbond Electronics Corp., Taichung (TW)

(72) Inventor: Yen-Jui Chu, Taichung (TW)

(73) Assignee: Winbond Electronics Corp., Taichung (TW)

(*) Notice: Subject to any disclaimer, the term of this patent is extended or adjusted under 35 U.S.C. 154(b) by 44 days.

(21) Appl. No.: 16/716,521

(22) Filed: Dec. 17, 2019

(65) Prior Publication Data

US 2021/0183764 A1     Jun. 17, 2021

(51) Int. Cl.
| | |
|---|---|
| *H01L 23/522* | (2006.01) |
| *H01L 23/00* | (2006.01) |
| *H01L 23/495* | (2006.01) |
| *H01L 21/50* | (2006.01) |
| *H01L 23/528* | (2006.01) |
| *H01L 21/60* | (2006.01) |

(52) U.S. Cl.
CPC .......... *H01L 23/5226* (2013.01); *H01L 21/50* (2013.01); *H01L 23/49503* (2013.01); *H01L 23/528* (2013.01); *H01L 24/43* (2013.01); *H01L 2021/60* (2013.01)

(58) Field of Classification Search
CPC ................. H01L 21/50; H01L 23/5226; H01L 23/49503; H01L 23/528; H01L 24/43
See application file for complete search history.

(56) References Cited

U.S. PATENT DOCUMENTS

| | | | |
|---|---|---|---|
| 9,991,222 B2 | 6/2018 | Chen | |
| 10,096,567 B2 | 10/2018 | Chen | |
| 10,283,473 B1* | 5/2019 | Yu | .......... H01L 25/0655 |
| 2015/0229017 A1* | 8/2015 | Suzuki | .......... H01L 23/66 |
| | | | 333/26 |

(Continued)

FOREIGN PATENT DOCUMENTS

| | | |
|---|---|---|
| CN | 107665876 | 2/2018 |
| TW | 201320209 | 5/2013 |

(Continued)

OTHER PUBLICATIONS

"Office Action of Taiwan Counterpart Application", dated Oct. 8, 2020, p. 1-p. 7.

*Primary Examiner* — Allan R Wilson
(74) *Attorney, Agent, or Firm* — JCIPRNET

(57) ABSTRACT

A package structure and method of forming the same are provided. The package structure includes a die, a redistribution structure and a conductive pad. The redistribution structure is disposed on and electrically connected to the die. The redistribution structure includes a dielectric film, a conductive line, an adhesive layer and a conductive via. The dielectric film has a first surface and a second surface opposite to each other. The conductive line and the adhesive layer are located between the first surface of the dielectric film and the die. The conductive line is electrically connected to the die, and the adhesive layer laterally surrounds the conductive line. The conductive via penetrates through the dielectric film and the adhesive layer to electrically connect to the conductive line. The conductive pad is electrically connected to the die through the redistribution structure.

10 Claims, 15 Drawing Sheets

(56) References Cited

U.S. PATENT DOCUMENTS

2019/0139925 A1* 5/2019 Yu .......................... H01L 24/24
2020/0373216 A1* 11/2020 Yoo ........................ H01L 24/29

FOREIGN PATENT DOCUMENTS

| | | |
|---|---|---|
| TW | 201701430 | 1/2017 |
| TW | 201919187 | 5/2019 |
| TW | I659511 | 5/2019 |

* cited by examiner

PACKAGE STRUCTURE AND METHOD OF FORMING THE SAME

BACKGROUND

Technical Field

The present invention relates to a package structure and a method of forming the same, and more particularly to a redistribution structure and a method of forming the same.

Description of Related Art

In the packaging process, a redistribution structure is usually used to redistribute the input/output (I/O) pads of a die. In the conventional method, the redistribution structure is formed by multiple processes such as deposition, sputtering, electroplating, photolithography and etching processes. In addition to the steps of the multiple processes are complex, material waste and machine cost may cause high manufacturing cost of the redistribution structure. Further, different masks need to be manufactured to define the redistribution layers for different product requirements. This will result in high manufacturing cost and long process time for manufacturing the redistribution structure and package.

SUMMARY

The disclosure provides a package structure and a method of forming the same, and in particular provides a redistribution structure and a method of forming the same. The method can simplify the forming process of redistribution structure, and can effectively shorten the manufacturing time and manufacturing cost of the redistribution structure.

The embodiments of the disclosure provide a package structure including a die, a redistribution structure, and a conductive pad. The redistribution structure is disposed on and electrically connected to the die. The redistribution structure includes a dielectric film, a conductive line, an adhesive layer, and a conductive via. The dielectric film has a first surface and a second surface opposite to each other. The conductive line and the adhesive layer are located between the first surface of the dielectric film and the die. The conductive line is electrically connected to the die, and the adhesive layer laterally surrounds the conductive line. The conductive via penetrates through the dielectric film and the adhesive layer to electrically connect to the conductive line. The conductive pad is electrically connected to the die through the redistribution structure.

The embodiments of the disclosure provide a method of forming a package structure including the following steps. A die is provided. A redistribution structure is disposed on and electrically connected to the die, wherein the redistribution structure includes a dielectric film, a conductive line, an adhesive layer and a conductive via. The dielectric film has a first surface and a second surface opposite to each other. The conductive line and the adhesive layer are located between the first surface of the dielectric film and the die, the conductive line is electrically connected to the die, the adhesive layer laterally surrounds the conductive line. The conductive via penetrates through the dielectric film and the adhesive layer to electrically connect to the conductive line. A conductive pad is formed on the second surface of the dielectric film and the conductive via, and the conductive pad is electrically connected to the die through the redistribution structure.

In view of the above, the disclosure forms a redistribution structure by forming conductive features and insulating features on a pre-provided dielectric film, and then attaching the dielectric film having the conductive features and the insulating features to a die. The forming process of the redistribution structure of the disclosure is simple, which can save manufacturing cost and effectively shorten the processing time.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
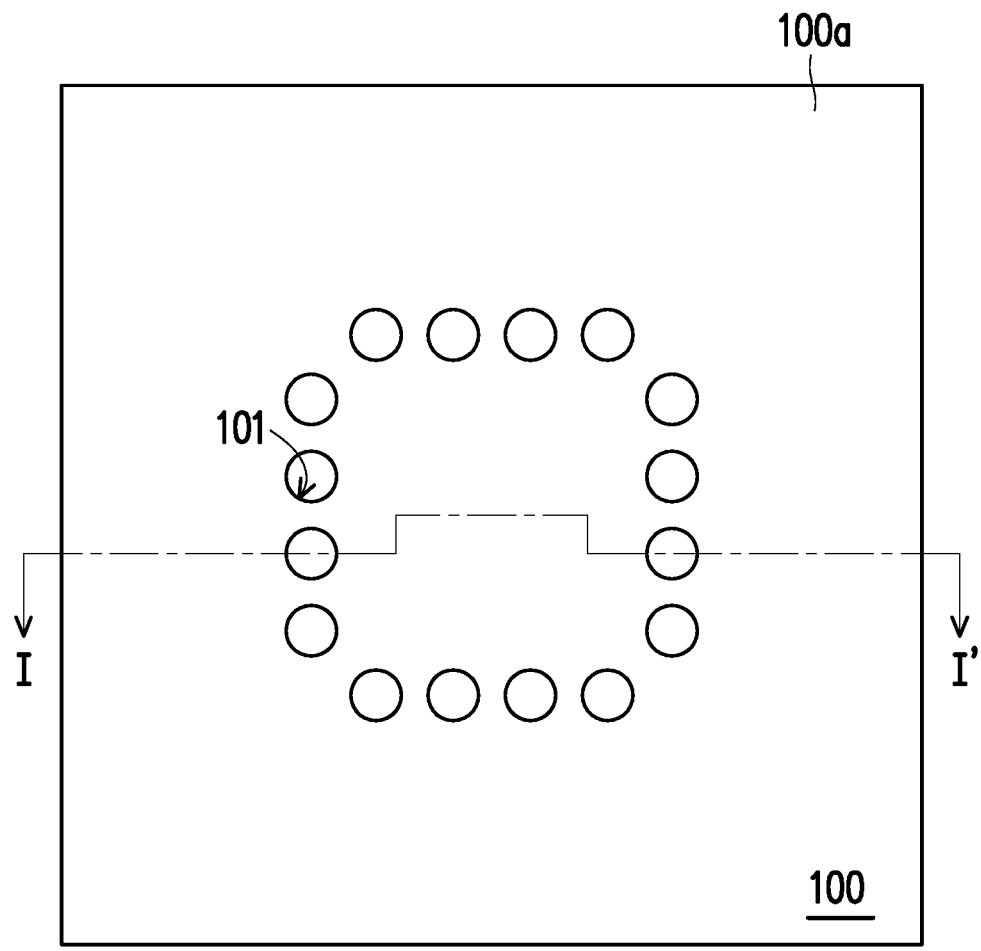
FIGS. 1A-1F are schematic top views illustrating a method of forming a package structure in accordance with an embodiment of the disclosure.

The disclosure will be more fully described with reference to the drawings of the embodiments. However, the disclosure may be embodied in a variety of different forms and should not be limited to the embodiments described herein. The thickness of layers and regions in the drawings may be enlarged for clarity. The same or similar component numbers indicate the same or similar components. Accordingly, no further description thereof is provided hereinafter.

Figure 3:
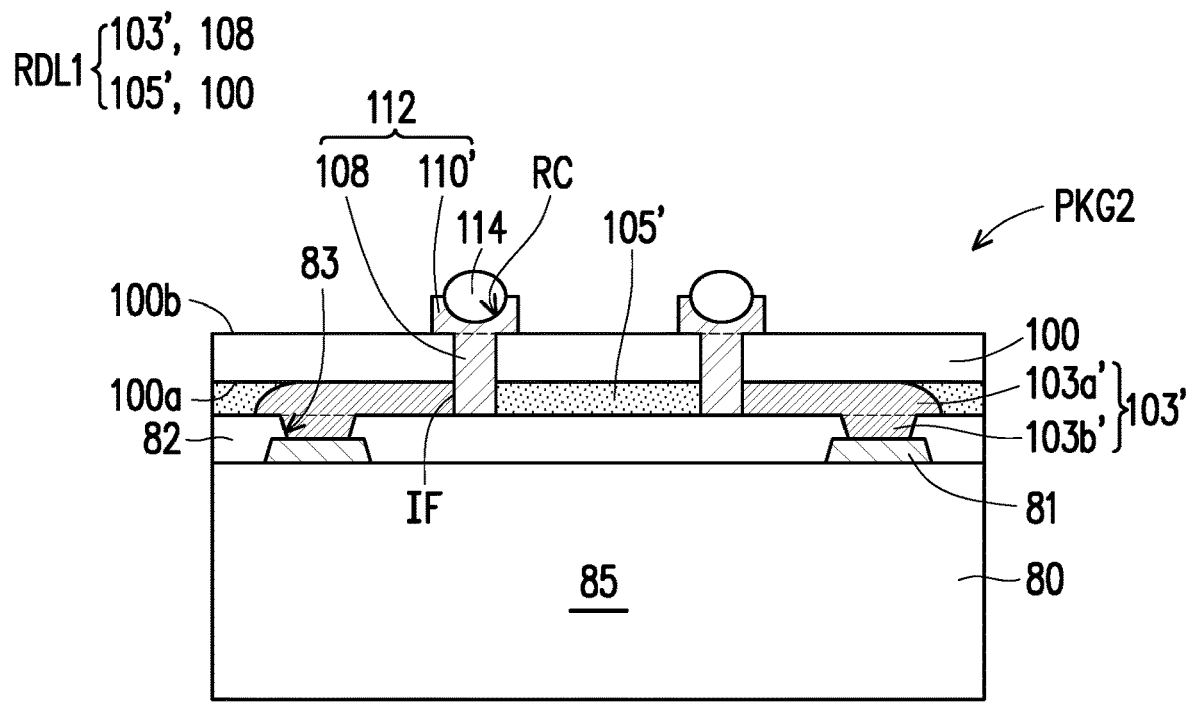
FIGS. 3-5 are schematic cross-sectional views illustrating a package structure according to some other embodiments of the disclosure.
Figure 4:
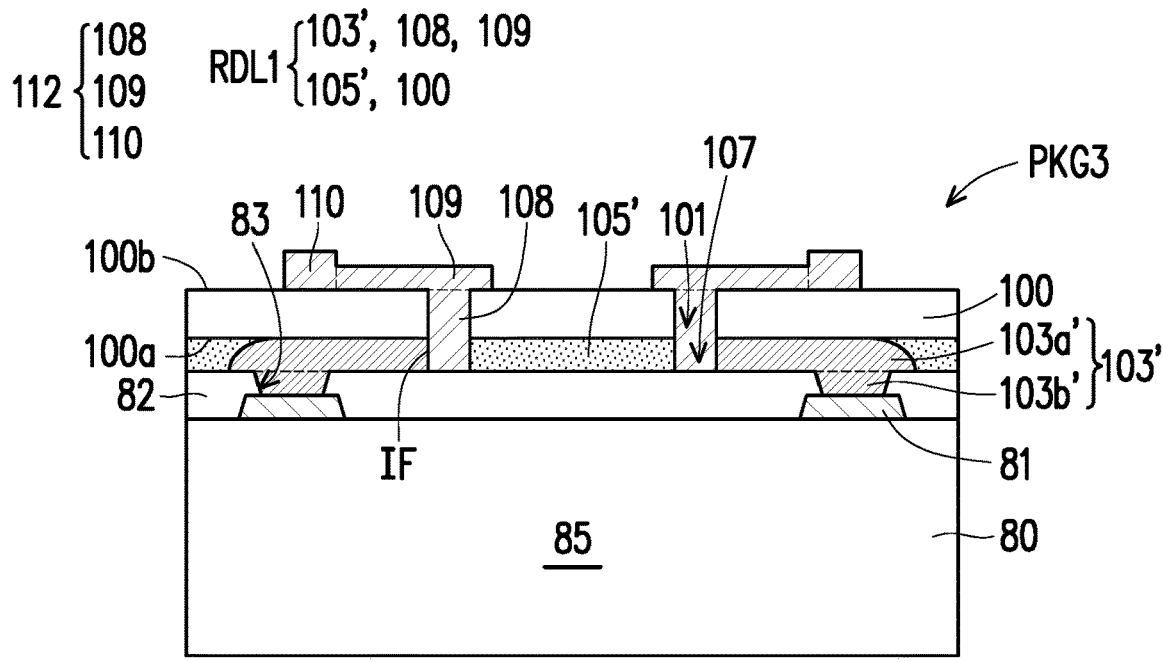
Figure 5:
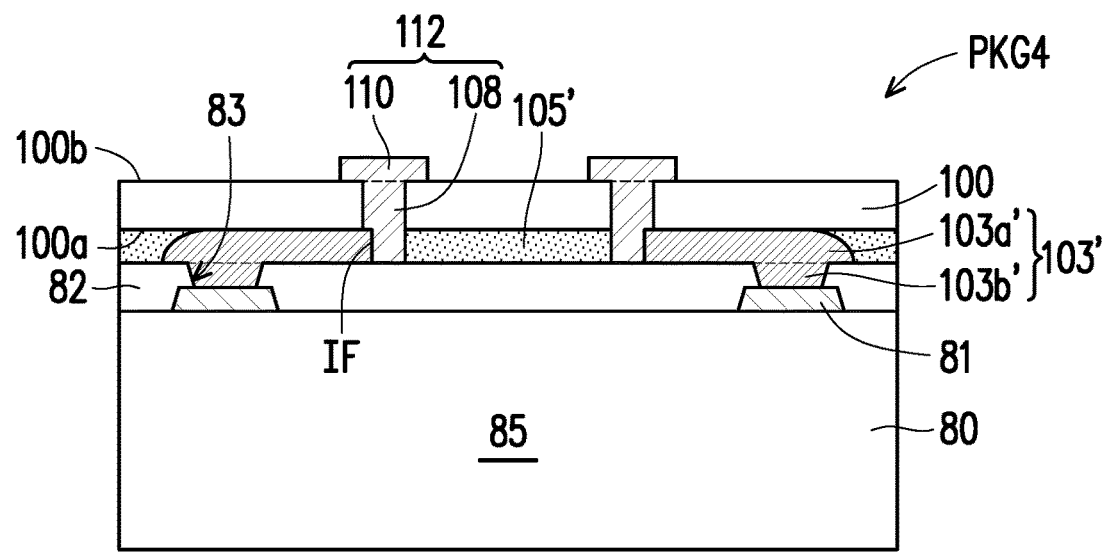

FIGS. 1A-1F are schematic top views illustrating a method of forming a package structure according to an embodiment of the disclosure. FIGS. 2A-2F are schematic cross-sectional views illustrating a method of manufacturing a package structure according to a first embodiment of the disclosure, wherein FIGS. 2A-2F respectively illustrates a cross-sectional view taken along a line II' of the corresponding one of FIGS. 1A-1F. FIGS. 3-5 are schematic cross-sectional views illustrating a package structure according to some other embodiments of the disclosure.

Figure 2A:
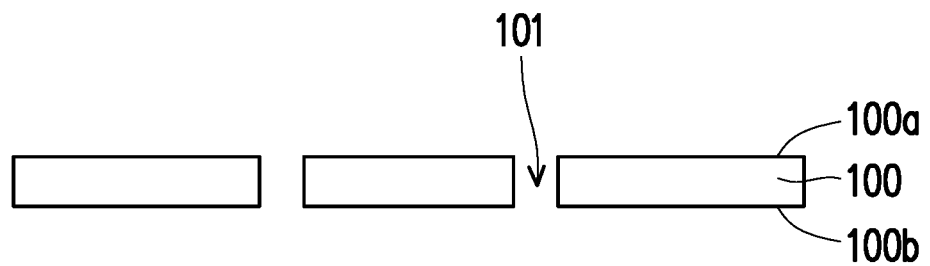
FIGS. 2A-2F are schematic cross-sectional views illustrating a method of forming a package structure according to a first embodiment of the disclosure, wherein FIGS. 2A-2F respectively illustrates a cross-sectional view taken along a line II' of the corresponding one of the FIGS. 1A-1F.

Referring to FIG. 1A and FIG. 2A, a dielectric film 100 is provided. The dielectric film 100 has a first surface 100a and a second surface 100b opposite to each other. The dielectric film 100 may include an inorganic dielectric material and/or an organic dielectric material. In one embodiment, the dielectric film 100 is a polymer film, including, for example, polyimide (PI), polybenzoxazole (PBO), benzocyclobutene (BCB), the like, or combinations thereof.

A plurality of openings 101 are formed in the dielectric film 100. In an embodiment, the openings 101 are formed by a mechanical punching process, for example. The openings 101 extend from the first surface 100a of the dielectric film 100 through the dielectric film 100 and extend to the second surface 100b. The openings 101 are via holes, for example.

Figure 1B:
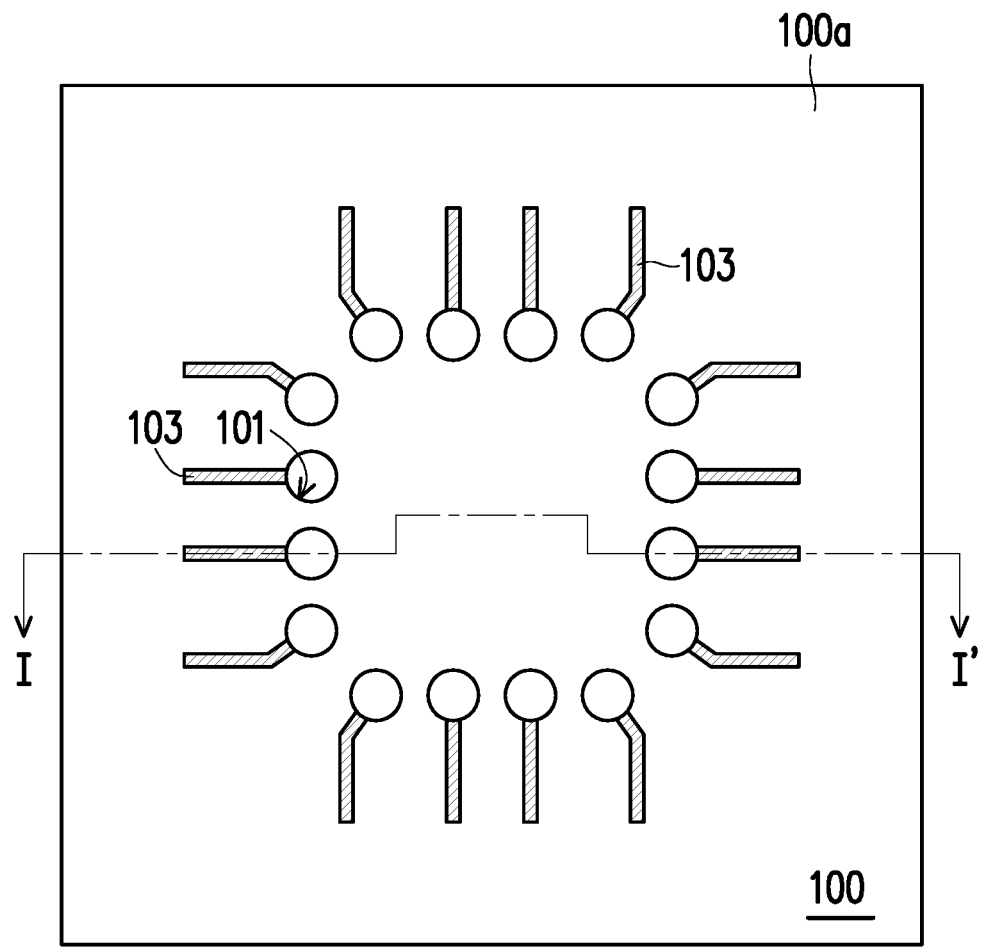
Figure 2B:
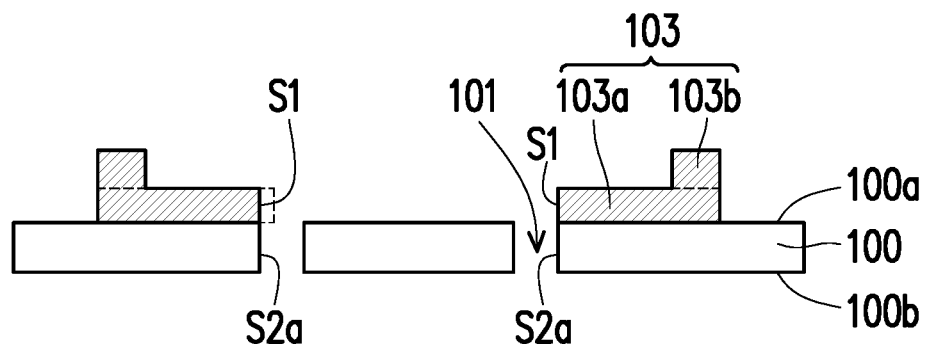

Referring to FIG. 1B and FIG. 2B, a plurality of conductive features 103 are formed on the first surface 100a of the dielectric film 100. The material of the conductive feature 103 may be a suitable metal such as copper, silver, gold or combinations thereof. In an embodiment, the conductive feature 103 includes metal particles, such as silver nanoparticles, copper nanoparticles, copper-silver alloy nanoparticles, gold nanoparticles, or the like, or combinations thereof. The conductive features 103 may be formed by a printing process such as screen printing process, inkjet printing process, three dimensional printing process, or the like. The printing process is performed by applying conductive ink to the first surface 100a of the dielectric film 100 at a position where the conductive features 103 are to be formed, and a curing process is then performed on the conductive ink, such that the conductive ink is cured to form the conductive features 103. The conductive ink includes a metal ink such as nano-silver ink, nano-copper-silver-alloy ink, nano-gold ink, or the like. The curing process includes heating the conductive ink or illuminating the conductive ink with a light. The heating process includes, for example, a low-temperature sintering process at a temperature of 250° C. or less (e.g. 160° C. to 200° C.). The illumination process uses a laser light or ultraviolet light or the like, for example. The above forming processes of the conductive features are merely for illustration, and the disclosure is not limited thereto, any suitable process may be used to form the conductive features 103.

In an embodiment, each of the conductive features 103 is formed adjacent to the opening 101 to border the corresponding opening 101. For example, the sidewall S1 of the conductive feature 103 is substantially aligned with the sidewall S2a of the opening 101. However, the disclosure is not limited thereto. In some other embodiments, the sidewall S1 of the conductive feature 103 may be slightly offset (e.g., to the right, as shown by the dashed lines in the cross-sectional view) from the sidewall S2a of the opening 101 in the horizontal direction. In an embodiment, the conductive feature 103 may extend beyond the sidewall S2a of the opening 101 and may further fill into at least a portion of the opening 101.

Referring to FIG. 2B, in an embodiment, the conductive feature 103 includes a body portion 103a and a protruding portion 103b connected to each other. The protruding portion 103b is located on the body portion 103a and is on an end of the body portion 103a away from the opening 101, but the disclosure is not limited thereto.

Figure 1C:
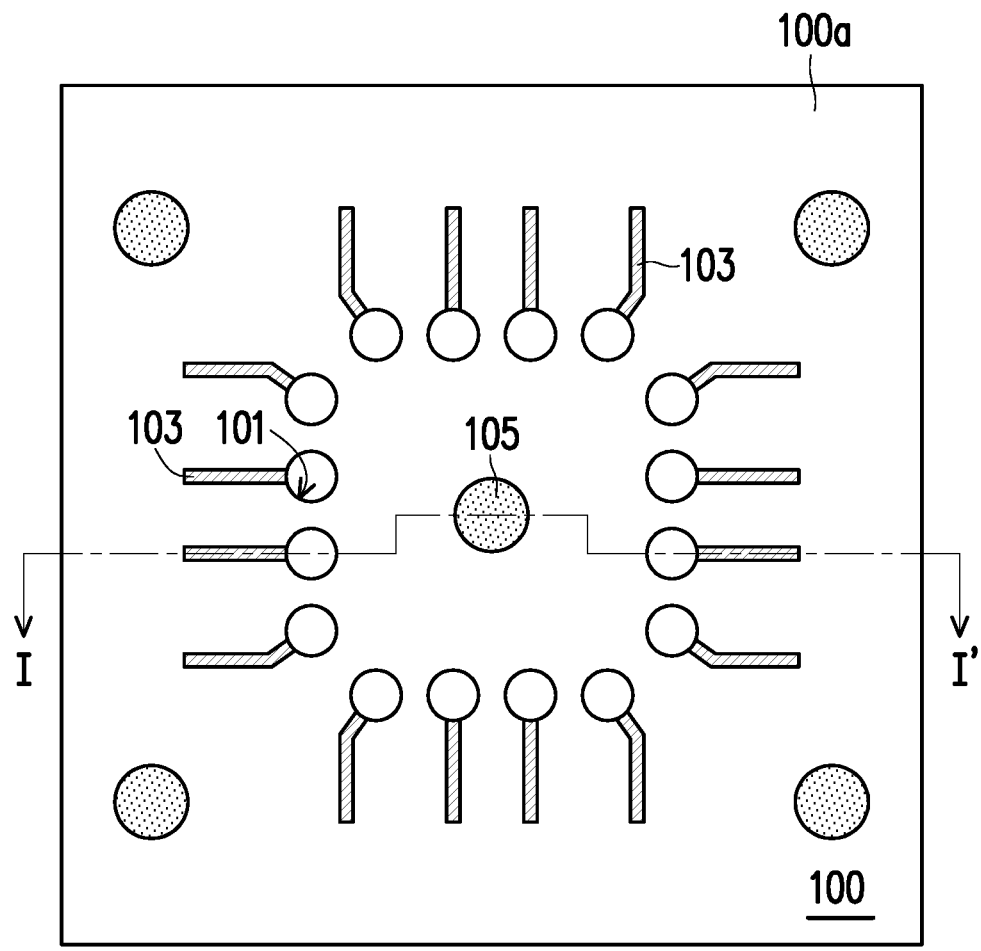
Figure 2C:
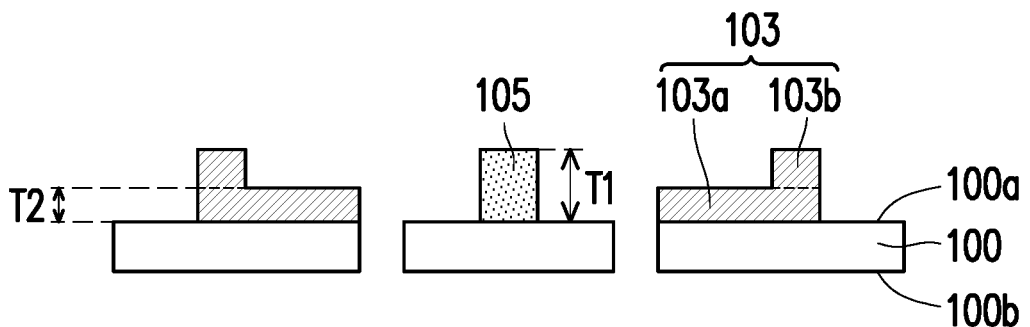

Referring to FIG. 1C and FIG. 2C, a plurality of insulating features 105 are formed on the first surface 100a of the dielectric film 100. In an embodiment, the insulating feature 105 may also be referred to as an adhesive. The insulating features 105 may include materials the same as or different from the material of the dielectric film 100. For example, the insulating feature 105 may include a polymer, such as polyimide, polyurethane, epoxy resin, or the like. The insulating features 105 may be formed by a printing process such as screen printing process, inkjet printing process, or 3D printing process. For example, an insulating ink is applied to the first surface 100a of the dielectric film 100 by the printing process to form a plurality of insulating features 105. In an embodiment, in the step shown in FIG. 1C and FIG. 2C, after the insulating ink is applied on the dielectric film 100 to form the insulating features 105, the insulating ink is not subjected to a curing process at this point. In an embodiment, a plurality of insulating features 105 are distributed on the first surface 100a of the dielectric film 100, and spaced from the plurality of conductive features 103a by a suitable distance. It should be understood that the position and number of the insulating features 105 shown in FIG. 1C and FIG. 2C are merely for illustration, and the disclosure is not limited thereto. The position and number of insulating features 105 may be adjusted according to product design and requirement. In an embodiment, the thickness T1 of the insulating feature 105 is larger than the thickness T2 of the body portion 103a of the conductive feature 103.

Figure 1D:
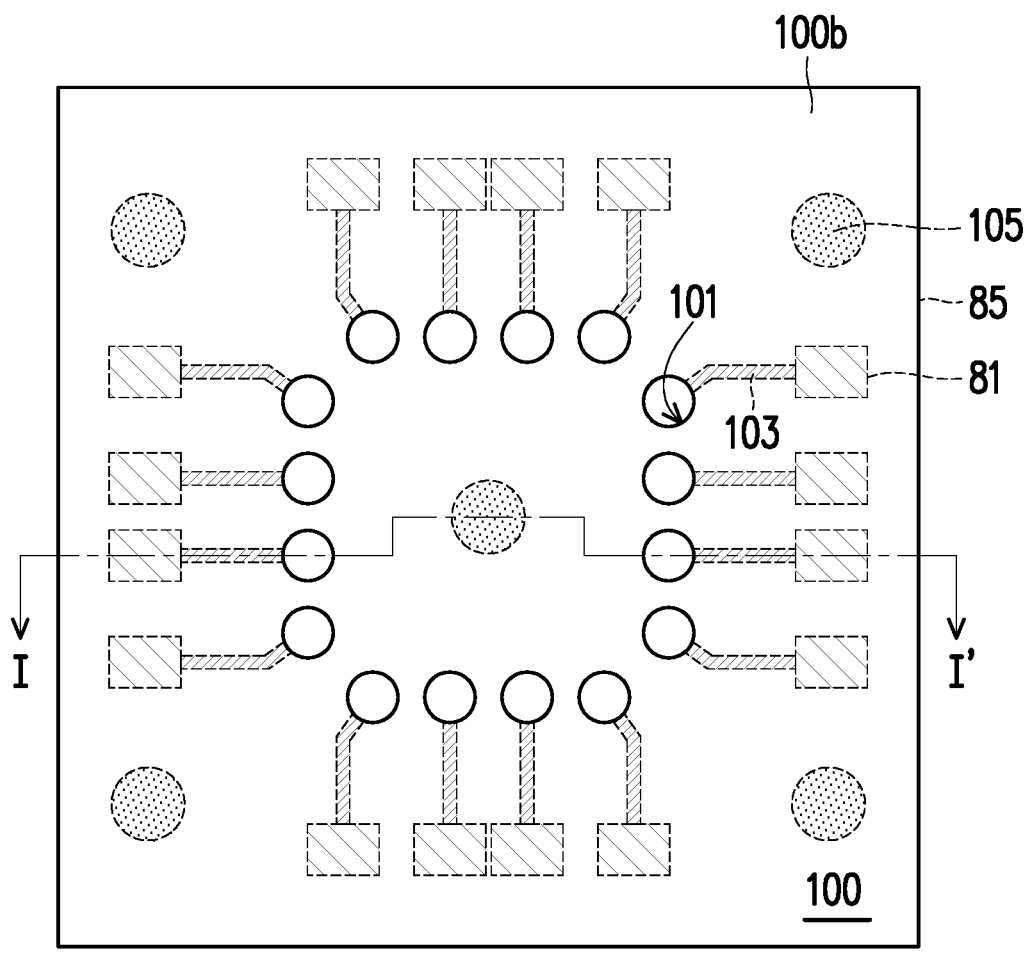
Figure 2D:
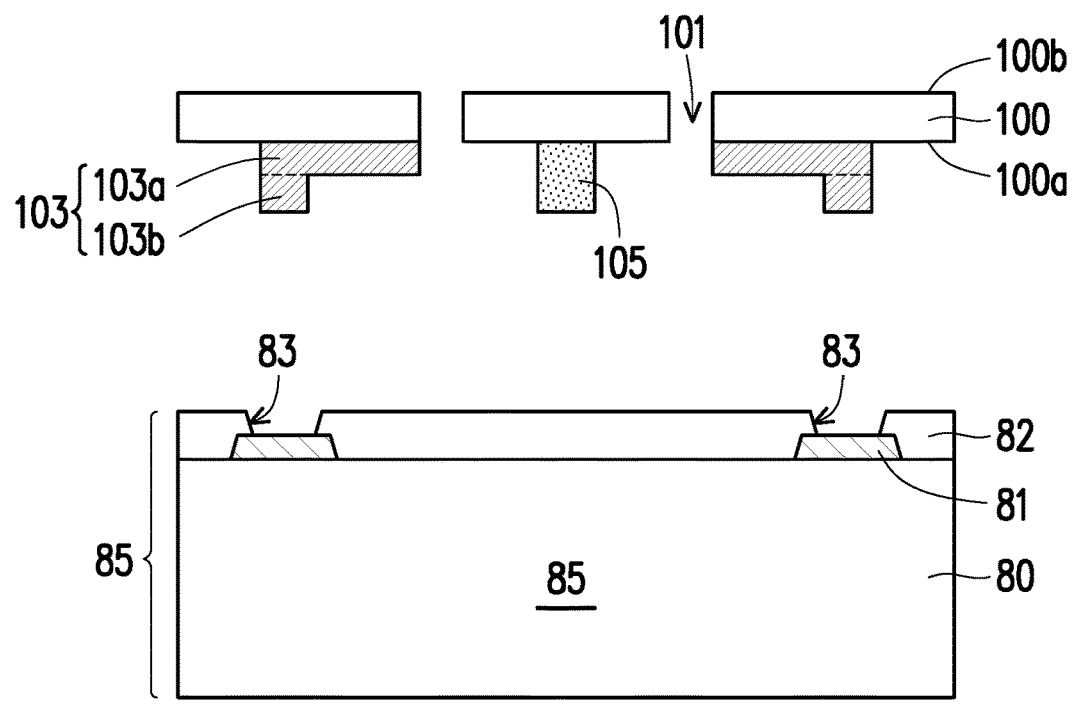

Referring to FIG. 1D and FIG. 2D, a die 85 is provided. In an embodiment, the die 85 includes a substrate 80, pads 81, and a passivation layer 82. The substrate 80 is a semiconductor substrate, such as a silicon substrate. The substrate 80 may include various devices formed thereon, such as active devices, passive devices, or a combination thereof (not shown). For example, the active devices may include transistors and/or diodes. The passive devices may include capacitors, inductors and/or resistors. In an embodiment, the die 85 may include an interconnection structure (not shown) over the substrate 80. The interconnection structure may include a plurality of metal lines and vias formed in a dielectric structure. The multi-layers of metal lines and the vias electrically connect the various devices on the substrate 80, so as to form a functional circuit.

The pads 81 are electrically connected to various devices on the substrate 80 by the interconnection structure, and serve as external connectors of the die 85. The pads 81 include conductive materials such as metal or metal alloy. In an exemplary embodiment, the pad 81 includes aluminum. The passivation layer 82 is formed on the pad 81 to cover portions of the surfaces of the pad 81. The passivation layer 82 has openings 83 exposing other portions of the surfaces of the pads 81, to provide external connections of the die 85. The passivation layer 82 includes silicon oxide, silicon nitride, silicon oxynitride, a polymer, or combinations thereof. The polymer is, for example, polyimide.

Still referring to FIG. 1D and FIG. 2D, the dielectric film 100 having the conductive features 103 and the insulating features 105 is placed over the die 85. In an embodiment, the dielectric film 100 is placed with the first surface 100a facing the die 85, and the protruding portions 103b of the conductive features 103 aligned with the openings 83 of the passivation layer 82.

Figure 1E:
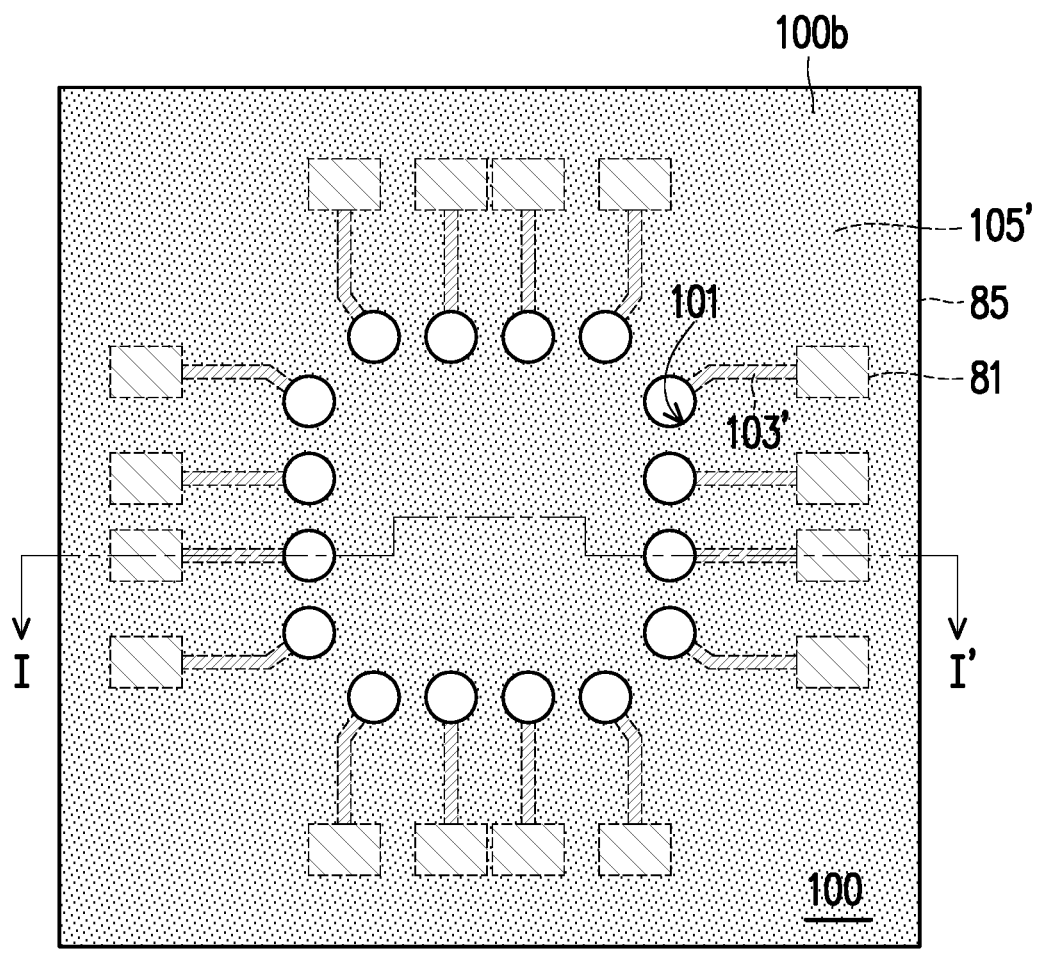
Figure 2E:
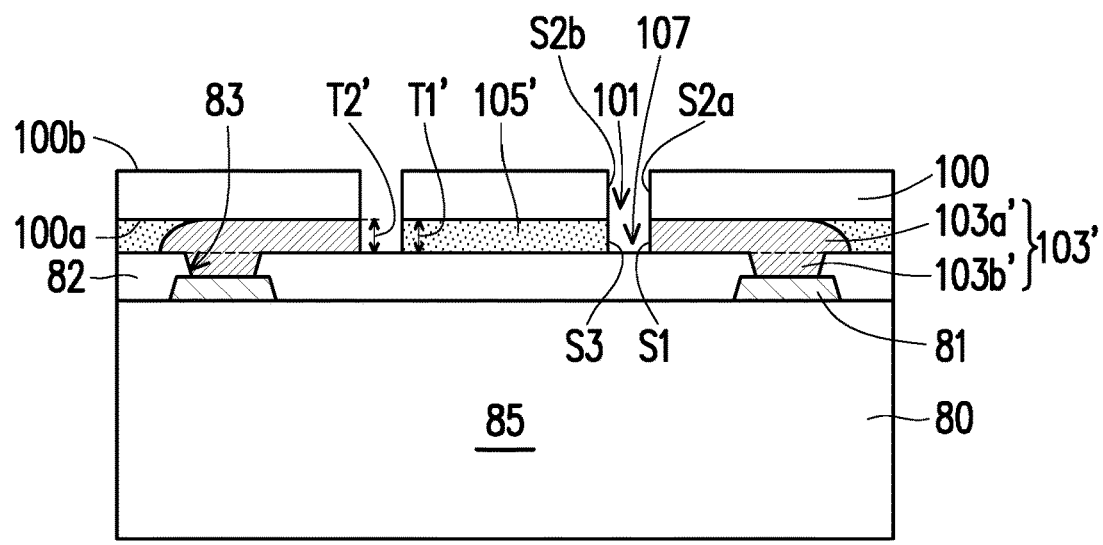

Referring to FIG. 1E and FIG. 2E, an attaching process is performed to attach the dielectric film 100 having the conductive features 103 and the insulating features 105 to the die 85, and conductive features 103' and an insulating layer 105' are formed. In an embodiment, the insulating layer 105' may also be referred to as an adhesive layer. In an embodiment, the attaching process may include the following steps: after aligning the dielectric film 100 with the die 85 as shown in FIG. 2D, the dielectric film 100 having the conductive features 103 and the insulating features 105 is placed on the die 85, and the film 100 is pressed such that the insulating features 105 and the conductive features 103 are attached to the die 85; a curing process is then performed to cure the insulating features 105. The curing process may include for example, performing a heating process at a temperature ranging from 160° C. to 200° C.

During the attaching process, the conductive features 103 are filled in the openings 83 of the die 85 and electrically connected to the pads 81. In an embodiment, the above curing process also cause a deformation of the conductive features 103, and the conductive features 103' including body portions 103a' and protruding portions 103b' are formed. The protruding portion 103b' protrudes from the bottom surface of the body portion 103a', and is located in the opening 83 of the passivation layer 82 of the die 85 to be in physical contact with and electrically connected to the pad 81. In an embodiment, the openings 83 are completely filled by the protruding portions 103b', and the protruding portions 103b' may also be referred to as conductive vias. The shape of the protruding portion 103b' is dependent on the shape of the opening 83. The body portion 103a' is located on the protruding portion 103b' and the passivation layer 82 of the die 85, and electrically connected to the pad 81 of the die 85 through the protruding portion 103b'. In an embodiment, the sidewall of the body portion 103a' near the protruding portion 103b' may be inclined or arced. The body portion 103a' may also be referred to as a conductive line or a trace.

In addition, during the attaching process, the insulating features 105 are expanded between the die 85 and the dielectric film 100, so as to form an adhesive layer 105'. The adhesive layer 105' is located on sides of conductive lines 103a', laterally surrounding and contacting the conductive lines 103a'. In an embodiment, the space between the first surface 100a of the dielectric film 100 and the die 85 is completely filled by the conductive features 103' and the adhesive layer 105', that is, the first surface 100a of the dielectric film 100 is completely covered by the conductive lines 103a' and the adhesive layer 105'. In an embodiment, the thickness T1' of the adhesive layer 105' is substantially equal to the thickness T2' of the conductive line 103a', and the top surface of the adhesive layer 105' is substantially level with the top surface of the conductive line 103a'. The thickness T2' of the conductive line 103a' is substantially equal to the thickness T2 of the body portion 103a prior to the attaching process. However, the disclosure is not limited thereto. The adhesive layer 105' may help increase the adhesion between the dielectric film 100 and the conductive features 103' and the die 85 as well as stress absorption.

In an embodiment, as shown in FIG. 2E, the sidewall S3 of the adhesive layer 105' may be substantially aligned with the sidewall S2b of the opening 101. The sidewall S3 of the adhesive layer 105' and the sidewall S1 of the conductive feature 103' form the opening 107 directly under the opening 101. However, the disclosure is not limited thereto. In some other embodiments, the adhesive layer 105' may be slightly offset (e.g., toward left or right) from the sidewall S2b of the opening 101 in the horizontal direction. In other words, the opening 107 is located directly under the opening 101 and in spatial communication with the opening 101. The sidewall of the opening 107 may or may not be aligned with the sidewall of the opening 101. The width of the opening 107 may be equal to, less than, or slightly larger than the width of the opening 101. In fact, the opening 107 may have any suitable size and shape, as long as the conductive material subsequently formed in the opening 107 and the opening 101 can be electrically connected to the conductive features 103'.

Although the dielectric film 100 is illustrated to be attached to one die 85 in the figures, the disclosure is not limited thereto. In some other embodiments, the dielectric film 100 may be attached to a wafer including a plurality of dies, or the dielectric film 100 may be attached to a plurality of dies that have been cut from a wafer. Further, in the illustrated embodiment, the die 85 has openings 83 and thus has unflat top surface, therefore, the conductive features 103 on the dielectric film 100 are formed to have protruding portions 103b corresponding to the openings 83, so as to facilitate the above-mentioned attaching process, but the disclosure is not limited thereto. In some other embodiments, the die 85 has a flat active surface and the conductive pad is exposed at the flat surface, and therefore the conductive features 103 on the dielectric film 100 may be formed to have a flat surface.

Figure 1F:
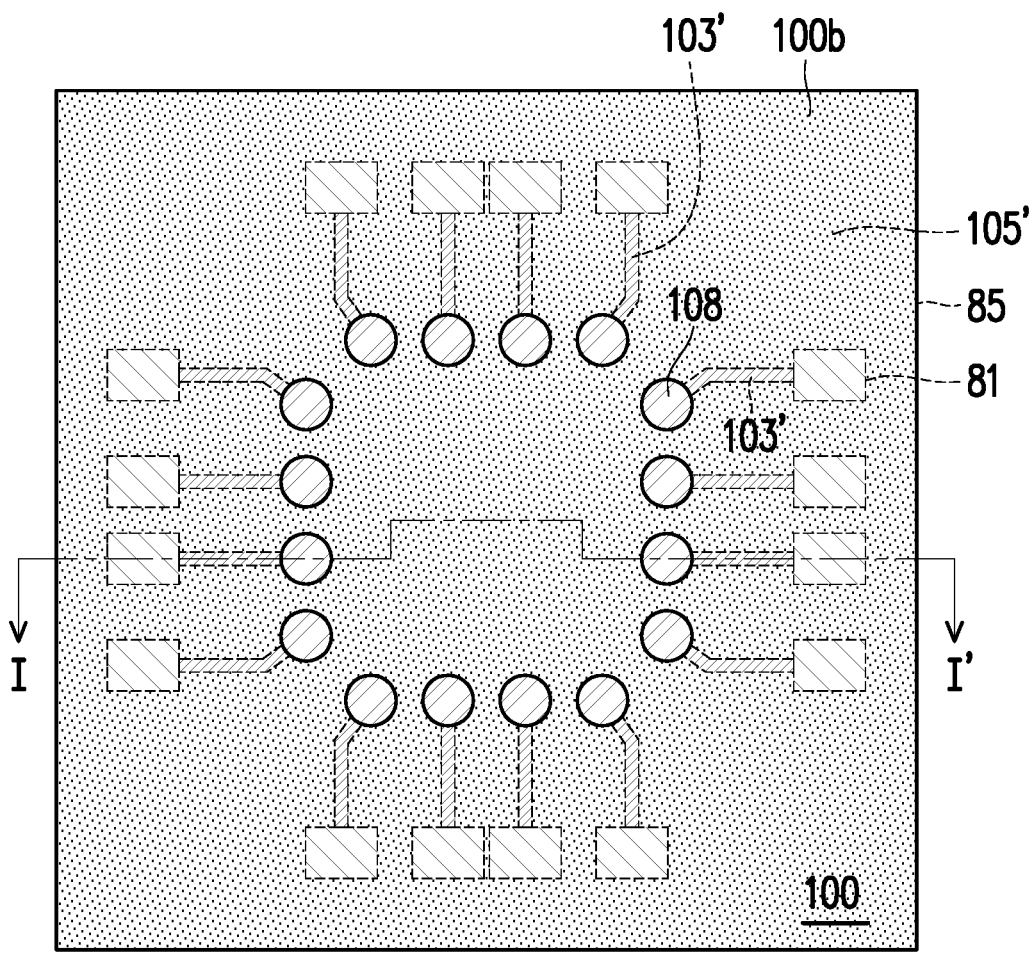
Figure 2F:
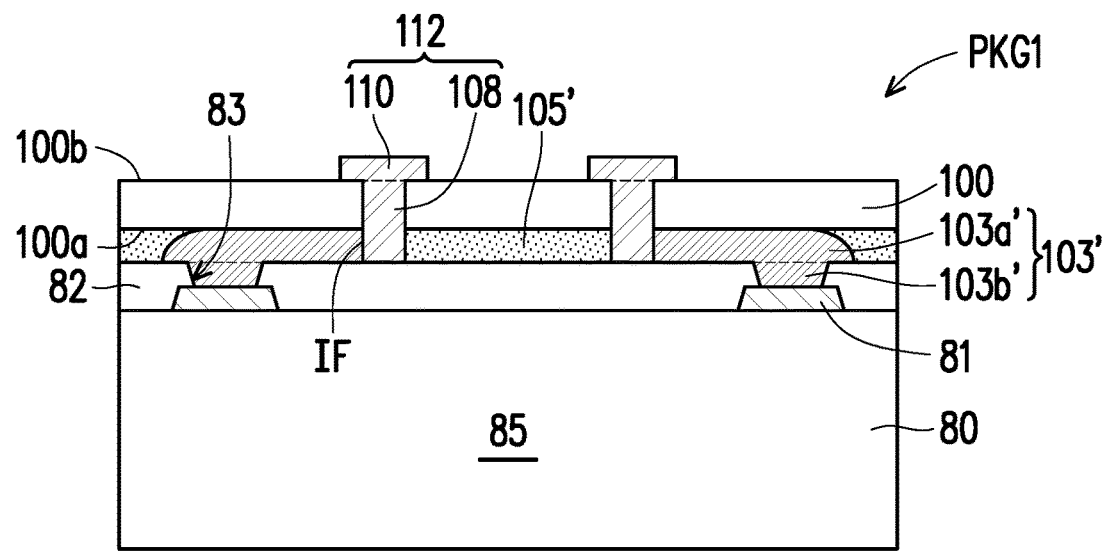

Referring to FIG. 1F and FIG. 2F, conductive features 112 are formed to at least fill the openings 101 and 107. The conductive features 112 are in physical contact with and electrically connected to the conductive features 103', and further electrically connected to the die 85 through the conductive features 103'. The material and forming method of the conductive features 112 are similar to those of the conductive features 103, which are not described again here. In an embodiment, the conductive features 112 are formed to fill the openings 101 and 107 and protrude from the second surface 100b of the dielectric film 100 and cover a portion of the second surface 100b. In other words, the conductive features 112 include conductive vias 108 in the openings 101 and 107 and conductive pads 110 on the conductive vias 108 and the second surface 100b of the dielectric film 100. The conductive vias 108 penetrate through the dielectric film 100 and the adhesive layer 105' to be in physical contact with and electrically connected to the conductive line 103a'. The conductive vias 108 are located on the passivation layer 82 of the die 85, laterally sandwiched between the conductive line 103a' and the adhesive layer 105' and interposed in the dielectric film 100. In other words, the bottom surface of the conductive via 108 is in contact with the passivation layer 82 of the die 85, and the conductive via 108 has at least a portion laterally aside the conductive line 103a'. The sidewalls of the conductive via 108 are in physical contact with the conductive line 103a', the adhesive layer 105', and the dielectric film 100. In the present embodiment, since the conductive via 108 and the conductive line 103a' are formed separately, an interface IF exists laterally between the conductive via 108 and the conductive line 103a'.

In the present embodiment, since the conductive pad 110 and the conductive via 108 are simultaneously formed, there is free of interface between the conductive pad 110 and the conductive via 108. In some other embodiments, the conductive via 108 and the conductive pad 110 may be formed separately and an interface may exist between the conductive via 108 and the conductive pad 110. In an embodiment, the conductive pad 110 has a substantially flat top surface. The conductive pad 110 is, for example, a bonding pad for wire bonding, and a bonding wire (not shown) may be further formed on the conductive pad 110. In an embodiment, the conductive features 103', the adhesive layer 105', the conductive via 108, and the dielectric film 100 constitute a redistribution structure RDL1.

Referring to FIG. 2F, a package structure PKG1 is thus formed. The package structure PKG1 includes the die 85, the redistribution structure RDL1, and the conductive pads 110. The conductive pads 110 are electrically connected to the die 85 through the redistribution structure RDL1. The redistribution structure RDL1 redistributes the external connection of the die 85 from the positions of the pads 81 to the positions of the conductive pads 110. In an embodiment, the package structure PKG1 may be further connected to other semiconductor devices through bonding wires.

FIGS. 3-5 are schematic cross-sectional views illustrating package structures according to some other embodiments of the disclosure.

Referring to FIG. 3, a package structure PKG2 is similar to the package structure PKG1 (FIG. 2F), except that the conductive pads 110' of the package structure PKG2 are used for disposing conductive connector such as solder balls. For example, the conductive feature 112 includes a conductive via 108 and a conductive pad 110', wherein the conductive pad 110' has a different shape than the conductive pad 110. The conductive pad 110' may have a recess RC, and the recess RC has, for example, a curved surface. In an embodiment, the recess RC is used for receiving a subsequently formed conductive connector 114. However, the disclosure is not limited thereto.

Still referring to FIG. 3, a plurality of conductive connectors 114 are formed on the conductive pads 110'. The conductive connector 114 may be formed by the following processes: a solder material is formed on the conductive pad 110' by, for example, solder printing, ball mounting or the like; thereafter, a reflow process is performed on the solder material to form the conductive connector 114 into a desired shape. In an embodiment, the conductive connector 114 may be a solder ball, but the disclosure is not limited thereto. In some other embodiments, the conductive connector 114 may include any suitable conductive material, such as solder, copper, aluminum, gold, nickel, silver, palladium, tin, or the like, or combinations thereof. In an embodiment, the conductive connector 114 may also be referred to as conductive terminal.

In the package structures PKG1 and PKG2, the conductive pads are disposed directly above the conductive via 108, that is, directly above the opening 101 of the dielectric film 100, but the disclosure is not limited thereto. In another embodiment, a conductive line may further be formed on the second surface 100b of the dielectric film 100 to redistribute the conductive pad to any other suitable position, according to product design and requirements.

As shown in FIG. 4, the redistribution structure RDL1 of the package structure PKG3 further includes an additional conductive line 109 on the second surface 100b of the dielectric film 100. For example, forming the conductive feature 112 further includes forming a conductive line 109 on the second surface 100b of the dielectric film 100, and the conductive pad 110 is disposed at the end of the conductive line 109 away from the conductive via 108. The conductive via 108, the conductive line 109, and the conductive pad 110 may be formed simultaneously or separately. In an embodiment, the top surface of the conductive pad 110 is formed to be higher than the top surface of the conductive line 109. In another embodiment, the top surface of conductive pad 110 may be substantially level with the top surface of conductive line 109. FIG. 4 illustrates the example in which the conductive pad 110 is used for wire bonding, but it should be understood that the conductive pad 110' may also be applied to the embodiment of FIG. 4. In an embodiment, a dielectric layer (not shown) may be formed or attached on the conductive line 109, so as to protect the conductive line 109.

Referring to FIG. 5, in an embodiment, the conductive line 103a' of a package structure PKG4 extends beyond the sidewall of the dielectric film 100 such that the conductive via 108 covers and contacts the sidewall and a portion of the top surface of the conductive line 103a'. The other structural features of the package structure PKG4 are similar to those of the package structure PKG1, which are not described again here.

Figure 6A:
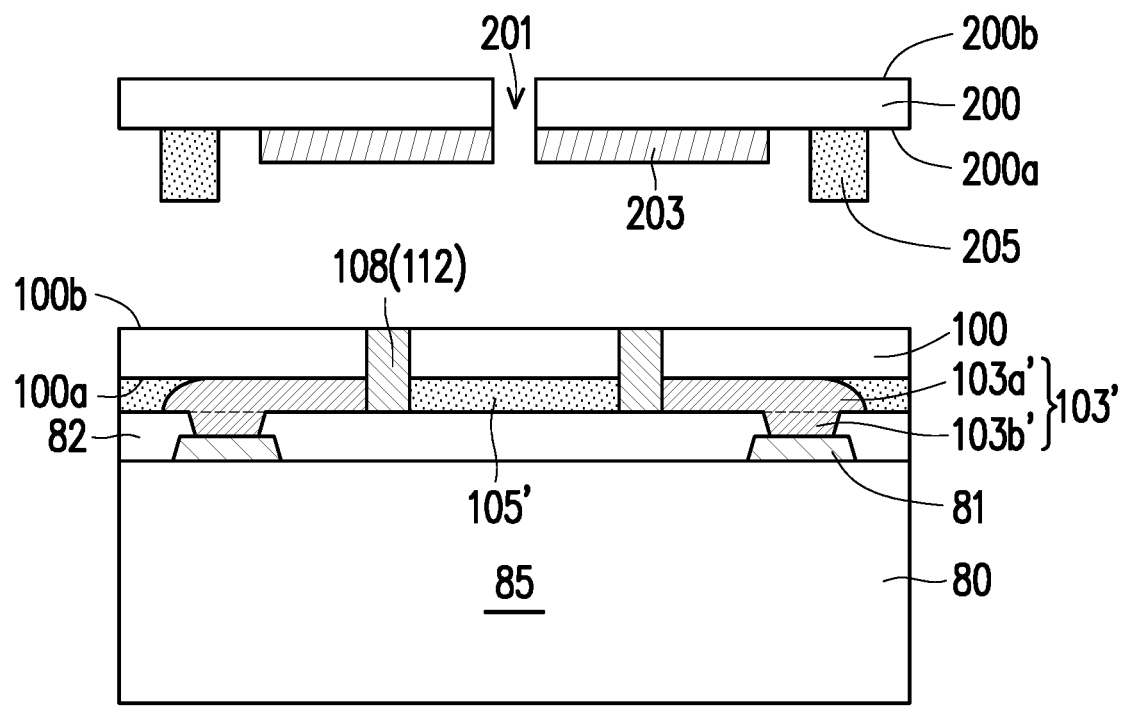
FIGS. 6A-6C are schematic cross-sectional views illustrating a method of forming a package structure according to a second embodiment of the disclosure.
Figure 6B:
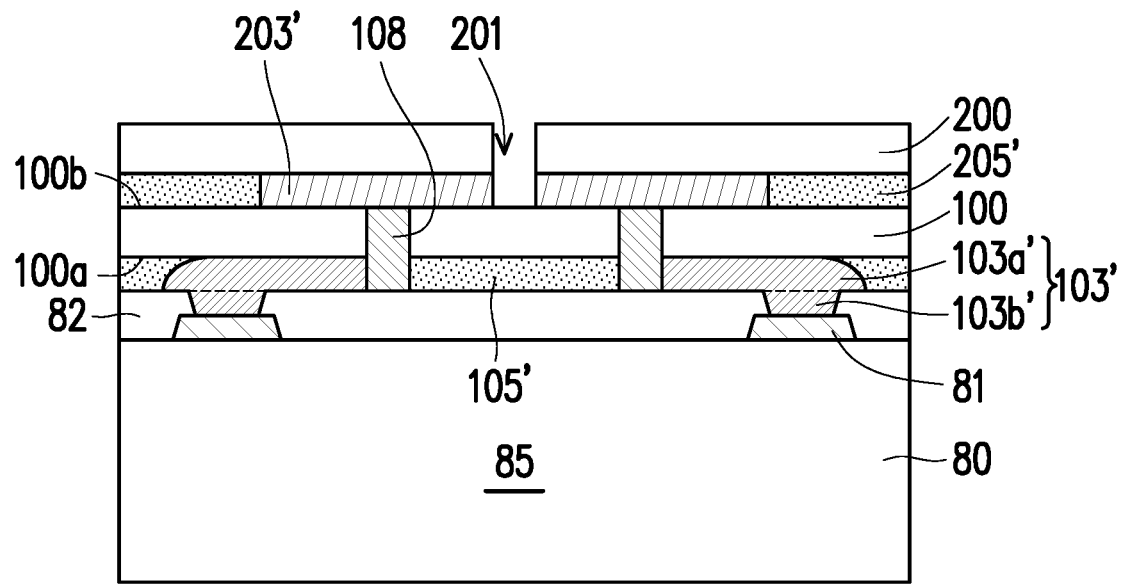
Figure 6C:
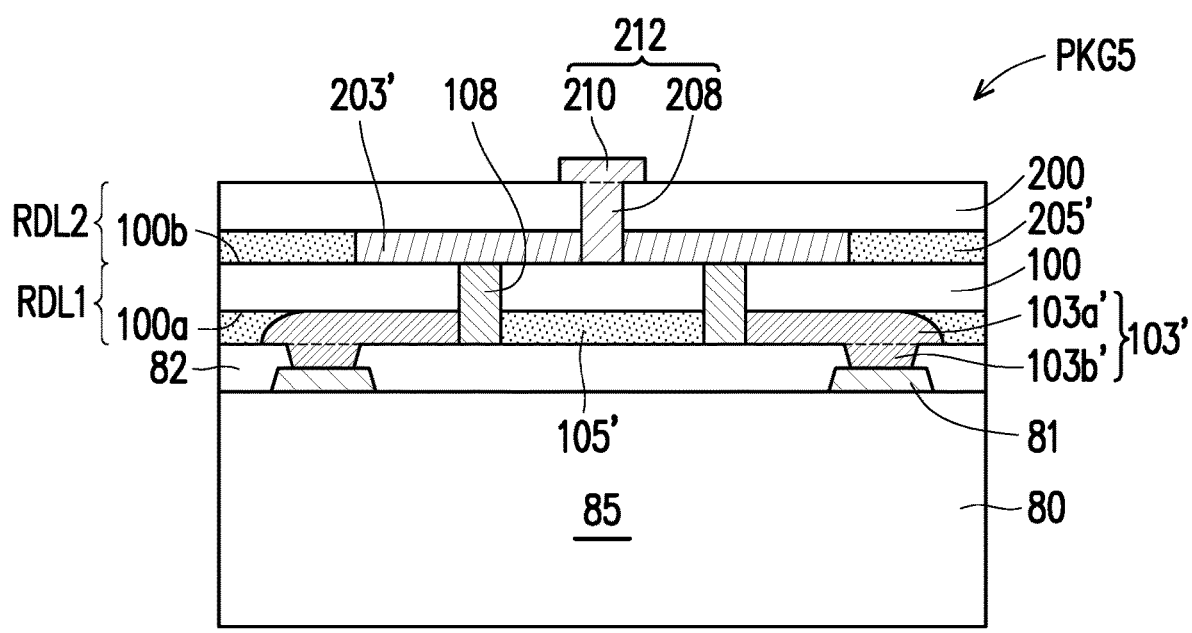

FIGS. 6A-6C are schematic cross-sectional views illustrating a method of forming a package structure according to a second embodiment of the disclosure. The second embodiment is similar to the first embodiment, except that the package structure includes a multi-layer redistribution structure in the second embodiment.

Referring to FIG. 2E and FIG. 6A, in an embodiment, after the attachment of the dielectric film 100 to the die 85 is completed, the conductive features 112 merely including the conductive vias 108 are formed. In an embodiment, the top surfaces of the conductive vias 108 are substantially coplanar with the second surface 100b of the dielectric film 100.

Referring to FIG. 6A, another dielectric film 200 is provided. The dielectric film 200 has a first surface 200a and a second surface 200b opposite to each other, and has one or more opening 201. A plurality of conductive features 203 and a plurality of insulating features (or referred to as adhesives) 205 are formed on the first surface 200a of the dielectric film 200. The materials and forming methods of the dielectric film 200, the conductive features 203, and the insulating features 205 are similar to those of the above-described dielectric film 100, conductive features 103, and insulating features 105, which are not be described again here. In an embodiment, since the conductive features 103 are attached to a flat surface, the conductive features 103 may not include protruding portions.

Referring to FIGS. 6A-6B, the dielectric film 200 is placed over and aligned with the dielectric film 100. Next, an attaching process similar to that of FIGS. 2D-2E is performed, so as to attach the dielectric film 200 having the conductive features 203 and the insulating features 205 to the second surface 100b of the dielectric film 100 and the conductive via 108, and a conductive layer (or referred to as a conductive line) 203' and an insulating layer (or referred to as an adhesive layer) 205' are formed between the dielectric film 200 and the dielectric film 100. The conductive line 203' is in physical contact with and electrically connected to the conductive via 108. The conductive line 203' may have a straight, inclined or arced sidewall. The adhesive layer 205' laterally surrounds and contacts the conductive line 203'.

Referring to FIG. 6C, processes similar to those of FIG. 2F, FIG. 3 or FIG. 4 are then performed to form a conductive feature 212. For the sake of brevity, FIG. 6C merely illustrate an example in which the conductive pad 210 of the conductive feature 212 is used for wire bonding. As shown in FIG. 6C, the conductive feature 212 include a conductive via 208 and a conductive pad 210. As such, a package structure PKG5 is thus formed. A bonding wire may be further formed on the conductive pad 210, and the package structure PKG5 may be connected to other semiconductor devices through the bonding wires.

The package structure PKG5 includes two layers of redistribution structures electrically connected to each other, wherein the conductive features 103', the conductive via 108, the adhesive layer 105' and the dielectric film 100 constitute the redistribution structure RDL1, the conductive line 203', the conductive via 208, the adhesive layer 205' and the dielectric film 200 constitute a redistribution structure RDL2. The conductive pad 210 is electrically connected to the die 85 through the redistribution structures RDL1 and RDL2. It should be understood that the number of layers of the redistribution structures formed in the above package structure is merely for illustration, and the package structure of the disclosure may be formed to have redistribution structures in any suitable number.

Figure 7A:
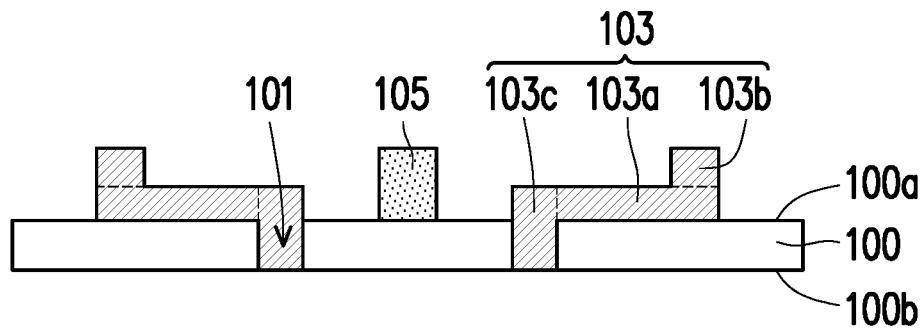
FIGS. 7A-7C are schematic cross-sectional views illustrating a method of forming a package structure according to a third embodiment of the disclosure.
Figure 7B:
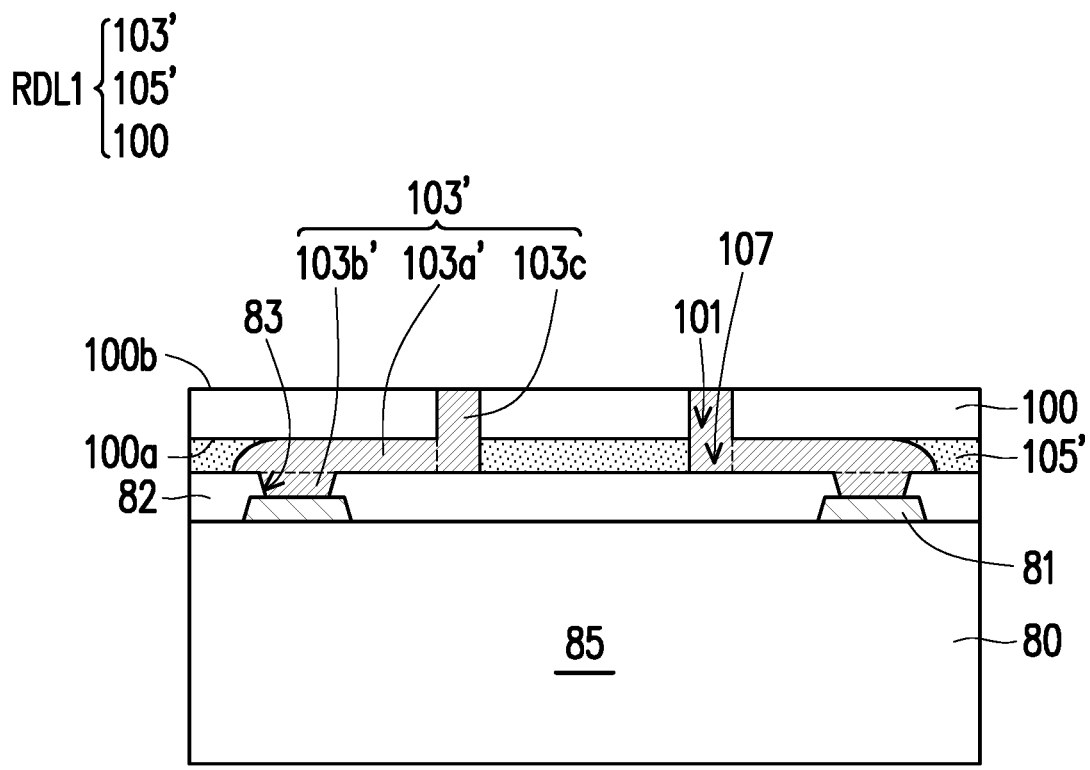
Figure 7C:
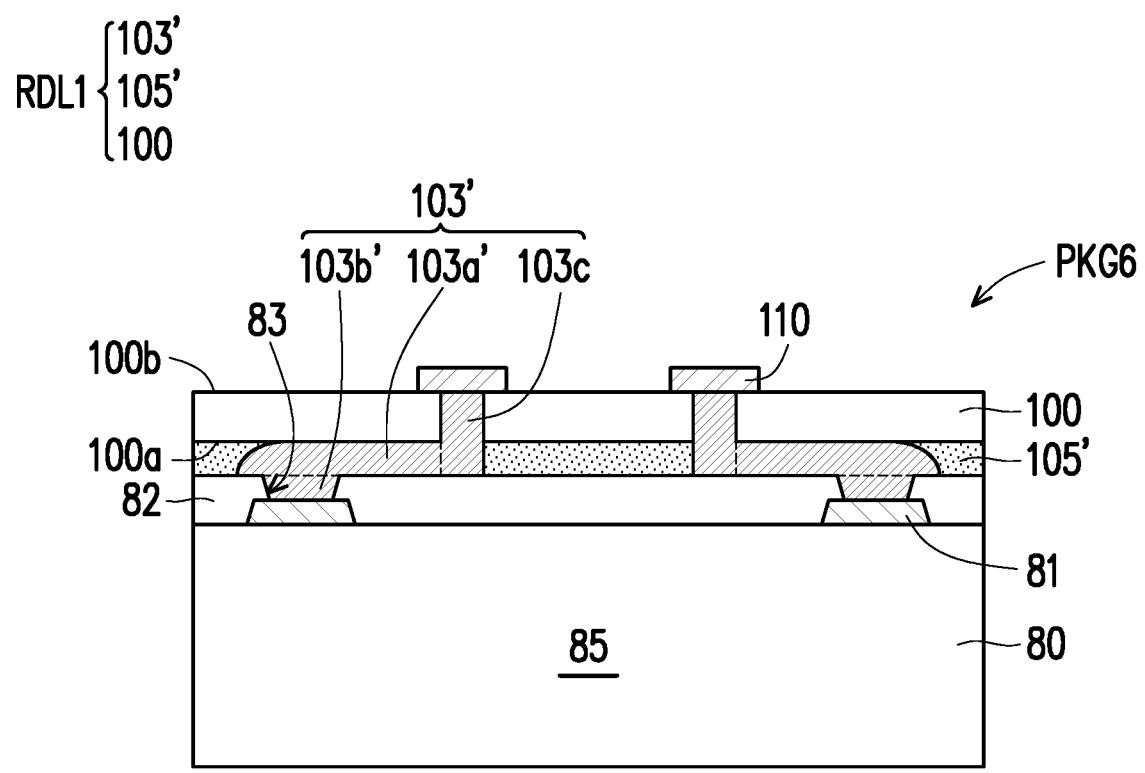

FIGS. 7A-7C are schematic cross-sectional views illustrating a method of forming a package structure according to a third embodiment of the disclosure. The third embodiment is similar to the first embodiment, except that the conductive via is formed in the opening of the dielectric film before the attaching process. The details are described as below.

Referring to FIG. 7A, a plurality of conductive features 103 and a plurality of insulating features 105 are formed on a dielectric film 100 having openings 101. In an embodiment, the conductive features 103 further fills into the openings 101 of the dielectric film 100. In other words, the conductive feature 103 includes a body portion 103a, a protruding portion 103b, and a via portion 103c.

Referring to FIG. 7B, processes similar to those described in FIGS. 2D-2E are performed to attach the dielectric film 100 having the conductive features 103 and the insulating features 105 to the die 85, and the conductive features 103' and an adhesive layer 105' are formed. The conductive feature 103' includes a protruding portion 103b' in the opening 83 of the die 85, a body portion (conductive line) 103a' on the die 85, and a via portion (conductive via) 103c penetrating through the dielectric film 100 and the adhesive layer 105'. The conductive features 103', the adhesive layer 105' and the dielectric film 100 constitute a redistribution structure RDL1.

Referring to FIG. 7C, conductive pads 110 are formed on the second surface 100b of the dielectric film 100 and the via portions 103c. As such, a package structure PKG6 is thus formed. The conductive pads 110 of the package structure PKG6 is illustrated as similar to the conductive pads of the package structure PKG1. It should be understood that, other types of conductive pads (such as the conductive pads shown in FIG. 3 or FIG. 4) may also be used. In the present embodiment, the conductive via 103c and the conductive line 103a' are simultaneously formed, and therefore, there is no interface between the conductive via 103c and the conductive line 103a'. The conductive pad 110 and the conductive via 103c are formed separately, and an interface exists between the conductive pad 110 and the conductive via 103c. The other structural features of the package structure PKG6 are similar to those of the package structure PKG1, which are not described again here.

In summary, in the disclosure, the conductive features and insulating features are formed on a pre-provided dielectric film, and the dielectric film having the conductive features and the insulating features are then attached to a die to form a redistribution structure. The forming process of the redistribution structure of the disclosure is simple, and omits complicated steps of deposition, sputtering, electroplating, photolithography and etching, etc., thereby saving manufacturing cost and effectively shortening the processing time, through which a redistribution structure can be rapidly formed. In addition, the positions of the conductive pads on the dielectric film may be adjusted according to different product requirements, and there is no need to manufacture different masks for different products, thereby reducing the initial development cost of the product.

Although the disclosure has been described with reference to the above embodiments, the disclosure is not limited to the embodiments, it will be apparent to one of ordinary skill in the art that modifications to the described embodiments may be made without departing from the spirit of the disclosure. Accordingly, the scope of the disclosure is defined by the attached claims.

What is claimed is:

1. A package structure, comprising:
   a die;
   a redistribution structure disposed on and electrically connected to the die, comprising:
   a dielectric film, having a first surface and a second surface opposite to each other;
   a conductive line and an adhesive layer, located between the first surface of the dielectric film and the die, the conductive line is electrically connected to the die, the adhesive layer laterally surrounds the conductive line; and
   a conductive via, penetrating through the dielectric film and the adhesive layer to electrically connect to the conductive line, wherein a portion of the conductive via is laterally aside the conductive line and sandwiched between the conductive line and the adhesive layer; and
   a conductive pad, electrically connected to the die through the redistribution structure.

2. The package structure of claim 1, wherein the conductive via and the conductive line have an interface therebetween.

3. The package structure of claim 1, wherein the redistribution structure further includes an additional conductive line, the additional conductive line is disposed on the second surface of the dielectric film and electrically connected to the conductive via and the conductive pad.

4. The package structure of claim 1, wherein the redistribution structure further comprises a protruding portion connected to the conductive line and protruding from a bottom surface of the conductive line, the protruding portion is electrically connected to a pad of the die.

5. A method of forming a package structure, comprising:
   providing a die;
   disposing a redistribution structure on and electrically connected to the die, wherein the redistribution structure comprises:
   a dielectric film, having a first surface and a second surface opposite to each other;
   a conductive line and an adhesive layer, located between the first surface of the dielectric film and the die, the conductive line is electrically connected to the die, the adhesive layer laterally surrounds the conductive line; and
   a conductive via, penetrating through the dielectric film and the adhesive layer to electrically connect to the conductive line, wherein a portion of the conductive via is laterally aside the conductive line and sandwiched between the conductive line and the adhesive layer; and
   forming a conductive pad on the second surface of the dielectric film and the conductive via, the conductive pad is electrically connected to the die through the redistribution structure.

6. The method of forming the package structure of claim 5, wherein disposing the redistribution structure on the die comprises:
   providing the dielectric film having an opening;
   forming a conductive feature and an insulating feature on the first surface of the dielectric film;
   performing an attaching process to attach the dielectric film having the conductive feature and the insulating feature to the die, such that at least a portion of the conductive feature form the conductive line, and the insulating feature is expanded between the dielectric film and the die to form the adhesive layer; and
   forming a conductive via in the opening after performing the attaching process.

7. The method of forming the package structure of claim 6, wherein the conductive via and the conductive line have an interface therebetween.

8. The method of forming the package structure of claim 5, wherein disposing the redistribution structure on the die comprises:
- providing the dielectric film having an opening;
- forming a conductive feature and an insulating feature on the first surface of the dielectric film, wherein the conductive feature further fills into the opening;
- performing an attaching process to attach the dielectric film having the conductive feature and the insulating feature to the die; after the attaching process, a portion of the conductive feature on the first surface of the dielectric film forms the conductive line, a portion of the conductive feature in the opening of the dielectric film forms the conductive via, the insulating feature is expanded between the first surface of the dielectric film and the die to form the adhesive layer.

9. The method of forming the package structure of claim 6, wherein the opening is formed in the dielectric film through a mechanical punching process.

10. The method of forming the package structure of claim 8, wherein the opening is formed in the dielectric film through a mechanical punching process.

* * * * *